(12) United States Patent
Kaloyanov

(10) Patent No.: US 12,032,007 B2
(45) Date of Patent: Jul. 9, 2024

(54) METHODS AND SYSTEMS FOR DETERMINING A PLURALITY OF ELECTRICAL PARAMETERS

(71) Applicant: IMAGINETEC LTD, London (GB)

(72) Inventor: Ivan Kaloyanov, London (GB)

(73) Assignee: Imaginetec LTD, London (GB)

( * ) Notice: Subject to any disclaimer, the term of this patent is extended or adjusted under 35 U.S.C. 154(b) by 208 days.

(21) Appl. No.: 17/572,906

(22) Filed: Jan. 11, 2022

(65) Prior Publication Data
US 2023/0221358 A1 Jul. 13, 2023

(51) Int. Cl.
*G01R 27/02* (2006.01)
*G01R 27/26* (2006.01)
*G01R 35/00* (2006.01)

(52) U.S. Cl.
CPC ......... *G01R 27/02* (2013.01); *G01R 27/2605* (2013.01); *G01R 35/007* (2013.01)

(58) Field of Classification Search
CPC .. G01R 27/2605; G01R 35/007; G01R 27/26; G01R 27/02
See application file for complete search history.

(56) References Cited

U.S. PATENT DOCUMENTS

| 3,992,662 A | 11/1976 | Koepnick et al. |
| 4,788,488 A | 11/1988 | Kramer et al. |
| 2015/0330767 A1* | 11/2015 | Pohl ........................ G01B 7/023 324/671 |

* cited by examiner

*Primary Examiner* — Amy He
(74) *Attorney, Agent, or Firm* — Banner & Witcoff, Ltd.

(57) ABSTRACT

An apparatus comprises a signal generator; first and second electrodes, the second electrode being connected to a first terminal of the signal generator; a processor; and a first switch configured to connect the first electrode to the processor, the first switch having a first position and a second position. The processor is configured to determine one or more values of a first electrical parameter based on a signal received from the first electrode via the first switch in the first position, and to determine one or more values of a second electrical parameter based on a signal received from the first electrode via the first switch in the second position.

20 Claims, 3 Drawing Sheets

METHODS AND SYSTEMS FOR DETERMINING A PLURALITY OF ELECTRICAL PARAMETERS

FIELD

Methods and Systems described herein are for controlling, measuring and assessing the quality of material mediums in different aggregate statuses with or without generated electrostatic energy available in three acceptable intervals: "Norm", "Attention", "Risk" with their decimal subintervals.

It is accomplished by comparing the captured electrotechnical characteristics of the tested material medium to the corresponding electrotechnical characteristics of another homogenous material medium accepted as a "Standard" for comparing captured electrical characteristics using the same method and apparatus.

Generated under certain conditions and specificity of the material mediums electrotechnical energy is manifested as an electric field.

BACKGROUND

In material mediums with low electrical conductance respectively with high electrical resistance as a result of intentional actions for manufacturing articles or other benefits for people as well as natural dynamic internal processes such as fractions in movement of the material mediums, chemical, biochemical or other dynamic processes, positive and negative charges of electrical power—carriers of electrical energy, manifested as electrostatic field are generated, moved, stuck together, retained or diluted. Example of such mediums are batteries, capacitors, fast floating clouds and air layers, fast moving earth layers, in parts of living organisms and others.

The control and measurement of Electrotechnical Properties of the material medium itself with electrostatic energy in it simultaneously with one sensor of primary analog information and one electro controlling devise is problematic, because controlling and measuring two different properties requires two different sensors of analogue signals to form the primary information, the same way as it is problematic to control and measure both the volume and weight of an object with one sensor.

There is another problem for material mediums in a certain volume, in which the electrostatic energy is generated because of natural internal dynamic processes, as it is in the part of living organisms. It is due to the fact that if the two different by their nature quantities—energy and physical material medium, are tested with two different sensors for capturing primary analogue information and two different electro controlling devises, the mechanical matching of the pair of electrodes of the two sensors in the same non-matching points "a" and "b" of the material medium itself will lead to defective electro-technical interference to obtain correct data for the two different parameters of the tested material medium.

This is why two apparatuses are used in the study of cardiovascular activity in humans and animals. The electro cardiograph captures data for the electrostatical field from the respective pairs of contact points "leads", connected to the breast and limbs. The rheograph captures data for electrical resistance of the material medium between two other contact points of it but it means that the electrostatical energy and the material medium itself have different values. It leads to correlation inaccuracy and errors.

SUMMARY

According to some embodiments, there is provided an apparatus for determining a plurality of electrical parameters. The apparatus comprises a signal generator; first and second electrodes, the second electrode being connected to a first terminal of the signal generator; a processor; and a first switch configured to connect the first electrode to the processor, the first switch having a first position and a second position. The processor is configured to determine one or more values of a first electrical parameter based on a signal received from the first electrode via the first switch in the first position, and to determine one or more values of a second electrical parameter based on a signal received from the first electrode via the first switch in the second position.

The processor may be configured to control the first switch to move between said first position and said second position.

The apparatus may further comprise a second switch configured to selectively connect the first electrode to a second terminal of the signal generator, the second switch having a first position in which the first electrode is connected to the second terminal of the signal generator and a second position in which the first electrode is disconnected from the second terminal of the signal generator.

The processor may be configured to control the second switch to move between said first position and said second position.

The processor may be configured to control the first switch and the second switch to simultaneously move between said first positions and said second positions.

The processor may have a first input and a second input. When in the first position, the first switch connects the first electrode to said first input, and when in the second position, the first switch connects the first electrode to said second input.

The apparatus may further comprise a memory connected to the processor. The memory may be configured to store one or more reference values of the first electrical parameter and one or more reference values of the second electrical parameter. The processor may be configured to: compare the determined values of the first electrical parameter against the stored reference values of the first electrical parameter, compare the determined values of the second electrical parameter against the stored reference values of the second electrical parameter, and output a result of the comparisons.

The apparatus may further comprise a display connected to the processor and configured to output information relating to the determined values of the first electrical parameter and/or the determined values of the second electrical parameter.

The apparatus may further comprise a complex electrical impedance connected to a second terminal of the signal generator.

The signal generator may be a high frequency sine wave generator.

According to some embodiments, there is provided a system for determining a plurality of electrical parameters. The system comprises: a signal generator; and a plurality of channels, at least one of the channels comprising: first and second electrodes, the second electrode being connected to a first terminal of the signal generator, a processor, and a first switch configured to connect the first electrode to the processor, the first switch having a first position and a second position. The processor is configured to determine one or more values of a first electrical parameter based on a signal received from the first electrode via the first switch in the first position, and to determine one or more values of a second electrical parameter based on a signal received from the first electrode via the first switch in the second position.

The processor may be configured to control the first switch to move between said first position and said second position.

At least one of the channels may further comprise a second switch configured to selectively connect the first electrode to a second terminal of the signal generator, the second switch having a first position in which the first electrode is connected to the second terminal of the signal generator and a second position in which the first electrode is disconnected from the second terminal of the signal generator.

The processor may be configured to control the second switch to move between said first position and said second position.

The processor may be configured to control the first switch and the second switch to simultaneously move between said first positions and said second positions.

The processor may have a first input and a second input. When in the first position, the first switch connects the first electrode to said first input, and when in the second position, the first switch connects the first electrode to said second input.

At least one of the channels may comprise a memory connected to the processor. The memory may be configured to store one or more reference values of the first electrical parameter and one or more reference values of the second electrical parameter. The processor may be configured to: compare the determined values of the first electrical parameter against the stored reference values of the first electrical parameter, compare the determined values of the second electrical parameter against the stored reference values of the second electrical parameter, and output a result of the comparisons.

The system may further comprise a master processor configured to control and synchronize the operations of the plurality of channels.

According to some embodiments, there is provided a method of determining a plurality of electrical parameters. The method comprises: setting a switch in a first position, the switch being connected to a first electrode; supplying a signal to a second electrode; determining one or more values of a first electrical parameter based on a signal received from the first electrode via the switch in the first position, setting the switch in a second position; and determining one or more values of a second electrical parameter based on a signal received from the first electrode via the switch in the second position.

This summary is not intended to identify essential features of the claimed subject-matter. Nor is it intended to be used in isolation to determine the scope of the claimed subject-matter. Further features and embodiments will become apparent from the following description and accompanying drawings.

DETAILED DESCRIPTION

With the proposed Method and Apparatus for Controlling, Measuring and Assessing the quality of Material Mediums according to their Electrotechnical Characteristics, these problems are solved with improved quality and effectiveness in the way of testing material mediums.

It is achieved by an electrical circuit diagram of the operation with a single-sensor apparatus. It generates primary analogue real-time information for two connected electrical quantities of distinct nature. One, under voltage $V_{ab}(t)$ [V] characterises the quality of the material medium itself, the other-voltage electromotive force $e_{leq}(t)$ [V] characterises the quality of electrical energy available or generated in the material medium.

Figure 1:
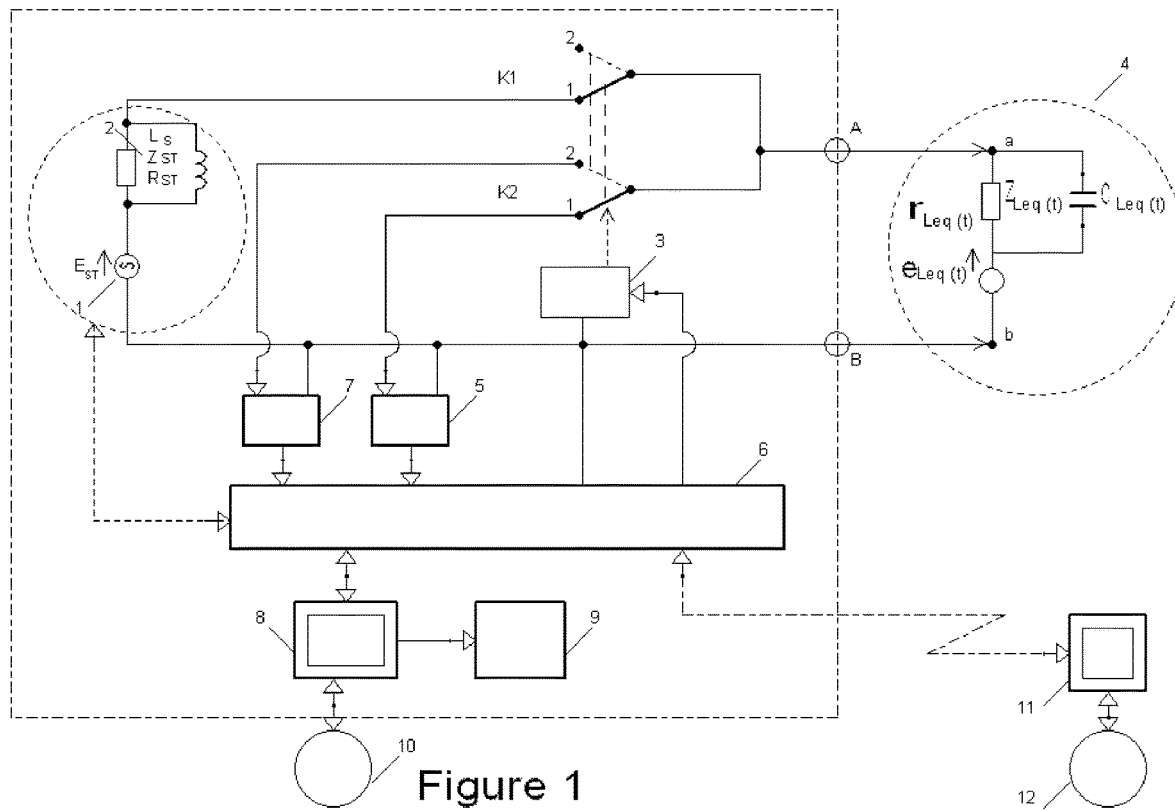
FIG. 1 is a diagram of a circuit according to an embodiment, the circuit being represented as a Thevenin circuit.
Figure 2:
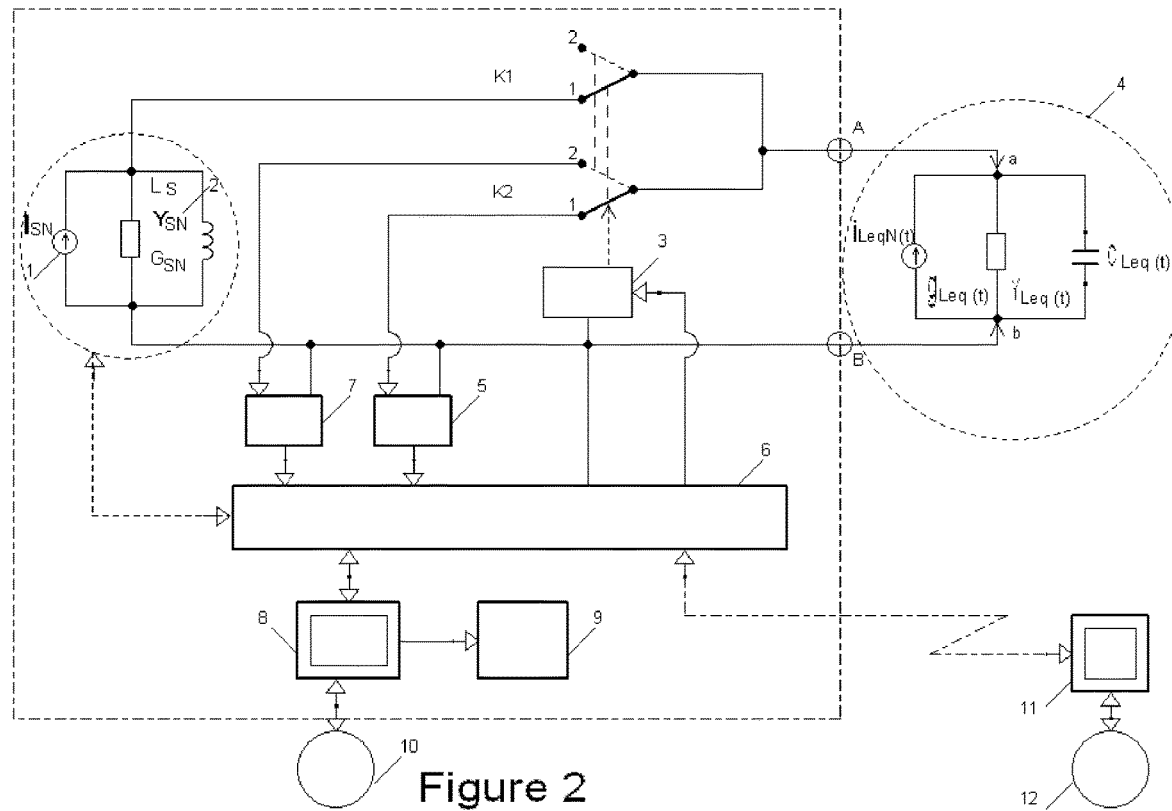
FIG. 2 is a diagram of the circuit shown in FIG. 1 represented as a Norton circuit.

The tested material medium (position 4), FIG. 1 and FIG. 2, generally with electrostatic energy available in it, is connected with its two non-matching contact points "a" and "b" as a $L^{th}$ active bilateral network into two formed electrical circuits.

One of the closed electrical circuit shown in FIG. 1 is formed by connecting in series of the following elements:

The one output electrode of zero or high frequency sinusoidal generator (Position 1) is connected to the one end of a complex electrical impedance $Z_{ST}(\Omega)$ (Position 2), formed from connected in parallel resistor with resistance $R_{ST}(\Omega)$ and inductance of coil in Henrys Ls[H], the other end is connected to one end of a switch K1 in placement "1" controlled by an MPU (Position 6) through an electromagnetic relay—(Position 3), the other end is connected by a contact electrode "A" with a contact point "a" of the tested material medium (Position 4).

The other contact point "b" of the material medium is connected by a contact electrode "B" to the other output electrode of zero or high frequency generator (Position 1) and with the common null potential point.

In the course of measured, non-harmful currency $i_L(t)$[A] flowing through the contact points "a" and "b" of the tested material medium, under the action of zero or sinusoidal generator, a voltage potential difference $V_{ab}(t)$ [V] is formed between "a" and "b". The voltage potential difference $V_{ab}(t)$ [V] is passed as an analogue signal from contact point "a" by a contact electrode "A" to one end of a switch K2 in placement "1" controlled by an MPU (Position 6) through an electromagnetic relay-Position 3. From the other end of K2, the analogue signal $V_{ab}(t)$ [V] is passed to the input of the receiving—amplifying, analog—digital convertor (digital electronic voltmeter), Position 5, from its output, the digital signal $V_{ab}(t)$ [V] enters into a separate input of a microprocessor unit (MPU) (Position 6). The MPU records the digital signal $V_{ab}(t)$ [V] in the consecutive odd time interval $\Delta t$ or $\Delta T_I$ intervals.

At the end of intervals $\Delta t$ or $\Delta T_n$, according a software program, MPU (Position 6) sends a control impulse to the electromagnetic relay (Position3) which switches simultaneously the two paired contacts K1 and K2 in placement "2".

In the placement "2" the switch K1 cuts the electrical connection of the tested material medium—(Position 4) with zero or high frequency sinusoidal generator (Position 1) and the complex impedance $Z_{ST}[\Omega]$, formed of a resistor $R_{ST}$ and inductance of coil $L_s[H]$ (Position 2).

When there is an electrical energy available or generated between the contact points "a" and "b" in the tested material medium, the difference of the potentials of electrostatical field, in the points "a" and "b", which has the nature of a voltage e.m.f. source—$e_{leq}(t)$ [V] is passed as an analogue signal from the point "a" of the material medium by a contact electrode "A" and switch K2 in placement "2" into the input of a receiving-amplifying and analog-digital convertor (digital electrical voltmeter), Position 7.

From the receiving-amplifying and analog-digital convertor's output, the digital signal $e_{leq}(t)$ is passed to a separate input of MPU (Position 6). The MPU records the digital signal $e_{leq}(t)$ in the even time intervals $\Delta t$ or $\Delta T_{i+1}$ intervals.

At the end of interval $(\Delta t)_{i+1}$ or $\Delta T_{i+1}$, MPU (Position 6) is programmed to send a control impulse to the electromagnetic relay (Position 3), which switches simultaneously the two paired contacts K1 and K2 in placement "1".

This iterative procedure is repeated in series so that the $\Delta t$ or $\Delta T$ equal in time intervals are alternated with $V_{ab}(t)$ and $e_{leq}(t)$ signals.

In this sequential alteration and recording of the two digitalised signals $V_{ab}(t)$ and $e_{leq}(t)$, the CPU (Position 6), per software program, overlays without changing them during each ($\Delta t$ or $\Delta T)_i$ interval while i=1, 2, 3 . . . n, the actual during $(\Delta t)_{i+1}$ or $(\Delta T)_{i+1}$ $e_{leq}(t)$ signal and the previously memorised during the preceded $\Delta t_i$ or $\Delta T_i$ interval $V_{abeq}(t)$ signal.

Thus, MPU calculates in real time the instantaneous values of unknown electrotechnical characteristics of the tested material medium parameters between two contact points "a" and "b", according to derived corresponding dependencies, explained in the theoretical rationale.

For the slow-motion processes in the material medium, the instantaneous values are calculated for each $i^{th}$ $\Delta T$ interval but for high speed processes—for each $m^{th}\Delta t$ sub-interval by which is divided each $\Delta T$ interval as per the equation $$\frac{\Delta T}{\Delta t} = m.$$

The number "m" dimensionless integer and is selected depending on the speed rate of change in the electrical characteristics of the tested material medium.

The breaking of the time t[sec] into the $\Delta T$[sec] intervals and/or into short-term $\Delta t$[sec] intervals is done for linearization in parts of the electrotechnical characteristics of non-linear elements into the formed two electro-measuring circuits in simultaneous placement "1" and "2" of the switches K1 and K2, controlled by the MPU.

Time characteristics of all electrotechnical parameters of the tested material medium (Position 4) are indexed with "$_{leq}$" as they refer to a material medium, included as a $L^{th}$-branch in electro-measuring circuit, which branch may in general be composed of more than one internally connected elements. The $L^{th}$-branch can be an equivalent active or passive electrical bilateral network.

FIG. 1 and FIG. 2 (Position 1 and 2) show an equivalent power supplied active bilateral network under the terms of Thevenin's theorem, indexed with "s". FIG. 1 shows it by Thevenin's and its elements are additionally indexed with "T", respectively FIG. 2 shows it by Norton's and its elements are additionally indexed with "N".

In the operative memory of the MPU (Position 6) are recorded all constant values of the elements of the equivalent power supplied active bilateral network-EST respectively $I_{SN}$; $Z_{ST}$ respectively $Y_{SN}$; $R_{ST}$ respectively $G_{SN}$ and $L_S$.

In the operative memory of the MPU (Position 6) is recorded a set of time electrical characteristics of the relevant electrotechnical parameters of the "Standard" material medium and objects with required high quality, accepted as "Norm", obtained by the same method and apparatus from the arranged in the same way contact points "a" and "b" of the "Standard" material mediums and objects.

After equalising $(\Delta T)_i$ and $(\Delta t)_k$ intervals of the time actual electrotechnical characteristics of the tested material medium and the recorded corresponding time electrotechnical characteristics of the homogenous "Standard" material medium, MPU calculates and records the relevant time correlation differences $\delta_l(t)$ for each corresponding $l^{th}$ electrotechnical parameter of the tested material medium for t=$\Delta t_n$, n=1, 2, 3 etc. At consecutive intervals. To calculate $\delta_l(t)$ is used a formula for a relative error in [%] equal to the ratio of the difference between the momentary values of the respective $l^{th}$ electrotechnical parameter of the tested material medium and homogenous Standard medium to the momentary value of the electrotechnical parameter of the Standard medium multiplied by 100.

$$\delta_1(\Delta t)_n = \pm \frac{A_{lact}(\Delta t)_n - A_{lst}(\Delta t)_n}{A_{lst}(\Delta t)_n} 100[\%];$$

n=1, 2, 3 etc., in which $A_{tact}(\Delta t)_n$ is an actual momentary value of an $l^{th}$ electrotechnical parameter of the tasted medium in the relevant unit of measurement.

$A_{lst}(\Delta t)_n$ is a momentary value of the same $l^{th}$ electrotechnical parameter of the homogenous Standard medium in the same measurement unit.

Saved in the operative memory of the MPU (Position 6) time electrotechnical characteristics of the electrotechnical parameters of the tested material medium, as well as the corresponding time $\delta_l(t)$ correlation characteristics are ready for submission to the operator (Position 10) on a display and printer (Position 8 and 9).

In the same way continuously or on request of the operator (Position 12) the data from the MPU are input into a recording-visualising device (Position 11).

Multi-channelled apparatuses with autonomous electro-measuring channels operating in parallel can be constructed using the proposed method and apparatus.

Figure 8:
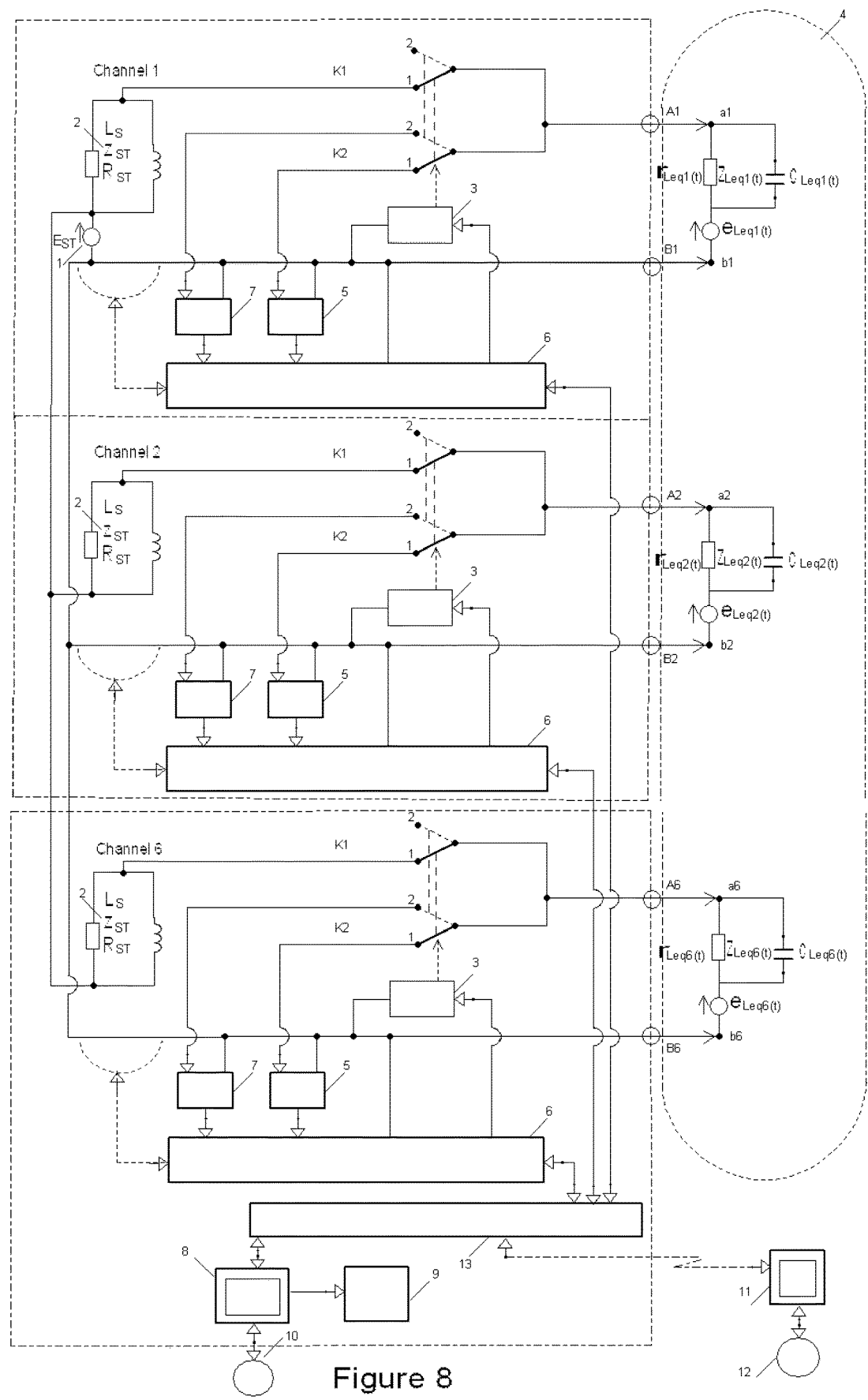
FIG. 8 is a diagram of a multi-channel system according to an embodiment.

FIG. 8 show an electrical circuit diagram of the operating of 6 channelled apparatus with a sufficient power high frequency sinusoidal generator (Position 1) supplying with the same frequency and constant effective value of the voltage the 6 autonomous operating electro-measuring channels with information from six pairs contact points of the tested material medium or objects. An MPU (Position 13) controls and synchronises all autonomous channels.

In three channelled apparatuses when the paired contact points of the tested material medium or object with electrostatic energy available "$a_1$" and "$b_1$"; "$a_2$" and "$b_2$"; "$a_3$" and "$b_3$" are located in three mutually perpendicular surfaces, the digitalised analogue signals of $e_{Leq}(t)$ and $i_{LeqN}(t)$ appear as their time projections on the three mutually perpendicular axes x, y and z. By software program, the MPU (Position 13) can calculate vector-time characteristics for these electrotechnical parameters.

The assessments of the analyse of the selected or all electrotechnical characteristics, including δ-correlation characteristics are made subjectively by a specialist-operator or automatically by criteria developed by licenced experts of the relevant field of application of constructed apparatuses included in a software program according to the proposed method and apparatus.

Thevenin's and Norton's theorems, applied under certain conditions, are the basis for the method and operation of the apparatus.

The electrical circuit diagram for the operation of the apparatus is designed according to these conditions. The required conditions are the following:

Sequential disconnection of the $L^{th}$ branch of the electro-measuring circuit with terminals "a" and "b" from the remaining part of the electro-measuring circuit and disconnection of the whole remaining part of the electro-measuring circuit from the $L^{th}$ branch with terminals "a" and "b". It is achieved by simultaneously switching into two identical alternate positions "1" and "2" of the switch contacts K1 and K2, controlled by MPU (Position 6) via an electromagnetic relay (Position 3) or by another means as shown in FIG. 1 and FIG. 2, in successive equal ΔT ort t time intervals.

Zero or single sinusoidal frequency in the electro— measuring circuit. This is accomplished with the intentionally constructed closed loop of the electro-measuring circuit, which includes a zero or high frequency sinusoidal generator (Position 1), providing a zero or single frequency in the closed loop of the electro-measuring circuit, where as a $L^{th}$ branch with two non-matching contact points/terminals is included the tested material medium.

Linear or linearized electro-measuring circuit. If there are non-linear elements in the closed loop of the electro-measuring circuit, what the tested material medium could be, the breaking of the prime analogue signals itself, formed by the tested material medium of the consecutive $(\Delta T)_i$ equal time intervals, as well as m-times shorter $(\Delta t)_k$ intervals, along with constantly calculated by the MPU instantaneous values of the electrotechnical characteristics of the tested material medium, we accept that we meet the requirements of the method of the linearization in parts on non-linear elements.

Ideal or idealized sources of electricity. The idealization in theoretical aspect of real, non-ideal sources of voltage electromotive force happens as the internal resistance is summed to the resistance in the branch in which this source is included, and in the case of real, non-ideal sources of current electromotive force, their internal conductivity is summed to the electrical conductivity of the branch where they are included. The idealisation of the real, non-ideal equivalent power supply in the apparatus, Position 1, with direct currency or sinusoidal generator is done by the instantaneous values of this source are transmitted to the CPU, Position 6, in the time interval when measuring the value $V_{ab}(t)$.

The perceived deductive approach—from general to private for deriving algorithmic dependencies requires the following summarised definition of Thevenin's and Norton's theorems.

Any arbitrarily complex linear or possible linearization of nonlinear electrical circuit with included active and passive bilateral networks with null or singular active frequency across the circuit, can be presented as two connected in parallel bilateral networks. The first one is the bilateral network in any $L^{th}$ branch with terminals "a" and "b galvanically disconnected from the remaining part of the electrical circuit. The second bilateral network is the entire remaining part of the electrical circuit with respect of the "a" and "b" terminals of the electro-galvanically disconnected $L^{th}$ branch.

The definition of the terms "passive bilateral network" and "active bilateral network" is:

Equivalent Passive bilateral network is a built-up element-branch of electrical circuit with two ends-poles "a" and "b" with no electrical energy between them. It is characterised with one or two electrotechnical parameters-electrical resistance $Z[\Omega]$ and electrical conductance $Y[S]$, bound by an equation $$Z = \frac{1}{Y}.$$

Figure 3:
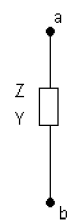
FIG. 3 is a diagram of an exemplary passive bilateral network.

FIG. 3 snows it in the electrical circuit.

Equivalent Active bilateral network is a built-up element-branch of electrical circuit with two ends-poles "a" and "b" with electrical energy between them. It is characterised with two or four electrotechnical parameters: source of electrical voltage $E_T[V]$ and successively connected with it electrical resistance $Z_T[\Omega]$, including internal resistance $R_i[\Omega]$ of the voltage source which idealises it and/or source of electromotive force $I_N[A]$ and connected in parallel electrical conductance $Y_N[S]$, including internal electrical conductance $G_i[S]$ of the source of electromotive force, which idealises it, bound by the equations:

$$I_N = \frac{E_T}{Z_T} = E_T Y_T; Z_t = \frac{E_T}{I_N}; Y_T = \frac{1}{Z_T} = Y_N = \frac{1}{Z_N}$$

Figure 4:
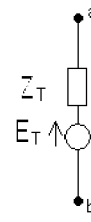
FIG. 4 is a diagram of an exemplary Thevenin circuit for an active bilateral network.
Figure 5:
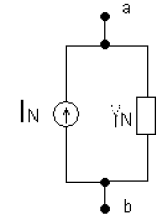
FIG. 5 is a diagram of an exemplary Norton circuit for an active bilateral network.

The index T is for Thevenin and the index N is for Norton. FIG. 4 and FIG. 5 show two equivalent electrical circuits, respectively in FIG. 4—equivalent active bilateral network by Thevenin's and in FIG. 5—equivalent active bilateral network by Norton's.

Figure 6:
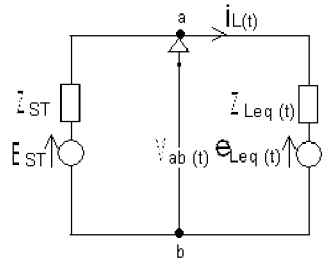
FIG. 6 is a diagram of an exemplary Thevenin circuit for two bilateral networks connected in parallel.
Figure 7:
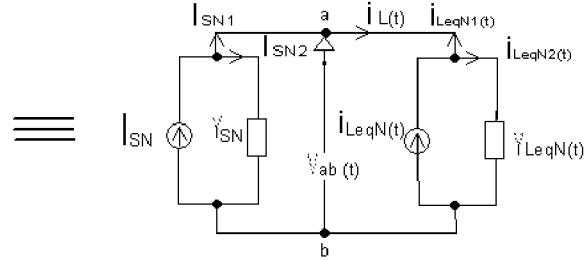
FIG. 7 is a diagram of an exemplary Norton circuit for two bilateral networks connected in parallel.

FIG. 6 and FIG. 7, in accordance with FIG. 1 and FIG. 2, show two identical electrical circuits diagrams of two equivalent bilateral networks connected in parallel in points "a" and "b". FIG. 6 shows them in Thevenin's and FIG. 7—in Norton's.

According to Yacoub Millman's Theorem for the parallel generator:

$$V_{ab} = \frac{E_1 \cdot Y_L + E_2 \cdot Y_2 + E_3 \cdot Y_3 + \ldots + E_n Y_n}{Y_1 + Y_2 + Y_3 + \ldots + Y_n} \quad (1)$$

Hence, for an electrical circuit diagram shown in FIG. 6:

$$V_{ab}(t) = \frac{E_{ST} Y_{ST} + e_{Leq}(t) Y_{Leq}(t)}{Y_{ST} + Y_{Leq}(t)}; \quad (2)$$

-continued $$Y_{Leq}(t) = \frac{1}{Z_{Leq}(t)} \text{ and } Y_{ST} = \frac{1}{Z_{ST}} = Y_{SN}$$

$$V_{ab}(t)Y_{ST} + V_{ab}(t)Y_{Leq}(t) = E_{ST}Y_{ST} + e_{Leq}(t)Y_{Leq}(t)$$

From where the complex admittance $Y_{Leq}(t)[S]$ will be equal to:

$$Y_{Leq}(t) = \frac{[E_{ST} - V_{ab}(t)]Y_{ST}}{V_{ab}(t) - e_{Leq}(t)} \quad (3)$$

for $t[\sec]=t_1, t_2, t_3 \ldots t_n$ when coequal $\Delta t[\sec]$ intervals are equal to $t_n-t_{n-1}$ The complex impedance is:

$$Z_{Leq}(t) = \frac{1}{Y_{Leq}(t)} = \frac{V_{ab}(t) - e_{Leq}(t)}{[E_{ST} - V_{ab}(t)]Y_{ST}} = \frac{[V_{ab}(t) - e_{Leq}(t)]Z_{ST}}{E_{ST} - V_{ab}(t)}[\Omega], \quad (4)$$

for $t[\sec]=t_1, t_2, t_3 \ldots t_n$ when coequal $\Delta t[\sec]$ intervals are equal to $t_n-t_{n-1}$ According to the Kirchhoff's Current Law in a closed circuit, the algebraic sum of voltage electromotive forces is equal to the algebraic sum of voltage potential differences, the equitation of the electrical circuit diagram in FIG. 6 is:

$E_{ST}-e_{Leq}(t)=i_L(t)Z_{ST}+i_L(t)Z_{Leg}(t)$ from where the electrical current $i_L(t)$ [A] will be:

$$I_L(t) = \frac{E_{ST} - e_{Leq}(t)}{Z_{ST} + Z_{Leq}(t)}[A], \quad (5)$$

for $t[\sec]=t_1, t_2, t_3 \ldots t_n$ when coequal $\Delta t[\sec]$ intervals are equal to $t_n-t_{n-1}$ By definition $I_N=E_TY_T$, when we substitute, the Millman's theorem will be presented in the following form:

$$V_{ab} = \frac{I_{N1} + I_{N2} + I_{N3} + \ldots + I_{Nn}}{Y_1 + Y_2 + Y_3 + \ldots + Y_n} \quad (6)$$

Hence the voltage potential difference in FIG. 7 is:

$$V_{ab}(t) = \frac{I_{SN} + i_{LeqN}(t)}{Y_{ST} + Y_{LeqN}(t)}[V], \quad (7)$$

for $t[\sec]=t_1, t_2, t_3 \ldots t_n$ when coequal $\Delta t[\sec]$ intervals are equal to $t_n-t_{n-1}$ $I_{LeqN}(t)$ is an equivalent short-circuit current or "Norton's current", which has a nature of the current electromotive force, tagged with an additional index N in the name of Norton.

Then by equation (7):

$$i_{LeqN}(t)=V_{ab}(t)[Y_{ST}+Y_{Leq}(t)]-I_{SN}[A], \quad (8)$$

for $t[\sec]=t_1, t_2, t_3 \ldots t_n$ when coequal $\Delta t[\sec]$ intervals are equal to $t_n-t_{n-1}$ The short-circuit current or "Norton's current" has the nature of a source of electrical current e.m.f. that would flow through the resistance $Z_{Leq}(t)$, under short-circuit conditions between the terminals "a" and "b" of the equivalent active bilateral network formed of the tasted material medium with electrical energy in it.

When substituted in equation (8), by definition $i_{LeqN}(t)=e_{Leq}(t)Y_{Leq}(t)$ and $I_{SN}=E_{ST}Y_{ST}$, will come to:

$$e_{Leq}(t)Y_{Leq}(t)=V_{ab}(t)[Y_{ST}+Y_{Leq}(t)]-E_{ST}Y_{ST};$$

$$e_{Leq}(t)Y_{Leq}(t)=V_{ab}(t)Y_{ST}+V_{ab}(t)Y_{Leq}(t)-E_{ST}Y_{ST}$$

Hence the complex electrical admittance $Y_{Leq}(t)$ will be equal to $$Y_{Leq}(t) = \frac{[E_{ST} - V_{ab}(t)]Y_{ST}}{V_{ab}(t) - e_{Leq}(t)}$$

i.e. we receive the same equation (3).

The complex impedance $$Z_{Leq}(t) = \frac{1}{Y_{Leq}(t)}$$

will be equal to:

$$Z_{Leq}(t) = \frac{V_{ab} - e_{Leq}(t)}{[E_{ST} - V_{ab}(t)]Y_{ST}} = \frac{[V_{ab}(t) - e_{Leq}(t)]Z_{ST}}{E_{ST} - V_{ab}(t)};$$

i.e. we receive the same equation (4).

In accordance with the marked directions of the currents in FIG. 7-$I_{SN}$, $I_{SN1}$, $I_{SN2}$, $i^{LeqN}(t)$, $i_{LeqN1}(t)$ and $i_{LeqN2}(t)$, for the measured harmless current flowing through the tested material medium, can be determined as:

$$i_L(t) = I_{SN1} - i_{LeqN1}(t) = I_{SN}\frac{Y_{Leq}(t)}{Y_{ST} + Y_{Leq}(t)} - i_{LeqN}(t)\frac{Y_{ST}}{Y_{ST} + Y_{Leq}(t)};$$

After substitution in equation (9), by definition $I_{SN}=E_{ST}Y_{ST}$ and $i_{LeqN}(t)=e_{Leq}(t)Y_{Leq}(t)$, the equitation (9) will be presented in the following form:

$$i_L(t) = E_{ST}Y_{ST}\frac{Y_{Leq}(t)}{Y_{ST} + Y_{Leq}(t)} -$$

$$e_{Leq}(t)Y_{Leq}(t)\frac{Y_{ST}}{Y_{ST} + Y_{Leq}(t)}\frac{Y_{ST}Y_{Leq}(t)}{Y_{ST} + Y_{Leq}(t)}[E_{ST} - e_{Leq}(t)] =$$

$$\frac{\frac{1}{Z_{ST}Z_{Leq}(t)}}{\frac{1}{Z_{ST}} + \frac{1}{Z_{Leq}(t)}}[E_{ST} - e_{Leq}(t)] = \frac{E_{ST} - e_{Leq}(t)}{Z_{ST} + Z_{Leq}(t)};$$

i.e. we receive the same equation (5).

In the private case for tested material mediums without available electrical energy in it, i.e. $e_{Leq}(t)=0$, the current $i_L(t)$ will be:

$$i_L(t) = \frac{E_{ST}}{Z_{ST} + Z_{Leq(t)}}[A], \quad (10)$$

for $t[\sec]=t_1, t_2, t_3 \ldots t_n$ when coequal $\Delta t[\sec]$ intervals are equal to $t_n-t_{n-1}$ By definition $E_{ST}=I_{SN}Z_{ST}$, the equation (10) can be presented in the following form:

$$i_L(t) = \frac{I_{SN}Z_{ST}}{Z_{ST} + Z_{Leq}(t)}[A], \quad (11)$$

for t[sec]=$t_1, t_2, t_3 \ldots t_n$ when coequal $\Delta t$[sec] intervals are equal to $t_n$–$t_{n-1}$ In this case, when $e_{Leq}(t)=0$, from the equation (3) the complex admittance $$Y_{Leq}(t) = \frac{[E_{ST} - V_{ab}(t)]Y_{ST}}{V_{ab}(t)}[S]; \quad (12)$$

for t[sec]=$t_1, t_2, t_3 \, t_n$ when coequal $\Delta t$[sec] intervals are equal to $t_n$–$t_{n-1}$ The complex electrical impedance $$Z_{Leq}(t) = \frac{1}{Y_{Leq}(t)}$$

will be equal to:

$$Z_{Leq}(t) = \frac{V_{ab}(t)}{[E_{ST} - V_{ab}(t)]Y_{ST}} = \frac{V_{ab}(t)Z_{ST}}{E_{ST} - V_{ab}(t)}[\Omega], \quad (13)$$

for t[sec]=$t_1, t_2, t_3 \, t_n$ when coequal $\Delta t$[sec] intervals are equal to $t_n$–$t_{n-1}$ The equitation (10) and equation (11) are in accordance with Thevenin and Norton's formulas, used as a method of analyses of electrical circuits with an arbitrarily chosen $L^{th}$ branch with terminals "a" and "b", acting for a passive bilateral network of known values of $Z_L$, respectively $Y_L$.

Once the formulas from the private case are applied as methods of analysis of electrical circuits according to Thevenin's and Norton's theorems it can be assumed that the general formulas-equations (3), (4),(5), from which the private ones come from, under the same conditions, can be applied as methods of analysis of electrical circuits with an arbitrarily chosen $L^{th}$ branch with terminals "a" and "b", acting for a passive or active bilateral network.

If in quotation (8) $i_{LeqN}(t)=V_{ab}(t)[Y_{ST}+Y_{Leq}(t)]–I_{SN}$, we substitute the dependences according to Ohm's Law $$i_{LeqN}(t) = \frac{e_{Leq}(t)}{Z_{Leq}(t)} = e_{Leq}(t)Y_{Leq}(t);$$

$$I_{SN} = E_{ST}Y_{ST};$$

$$V_{ab}(t) = \frac{E_{ST}Y_{ST} + e_{Leq}(t)Y_{Leq}(t)}{Y_{ST} + Y_{Leq}(t)};$$

Hence $$e_{Leq}(t)Y_{Leq}(t) = \frac{E_{ST}Y_{ST} + e_{Leq}(t)Y_{Leq}(t)}{Y_{ST} + Y_{Leq}(t)}[Y_{ST} + Y_{Leq}(t)] - E_{ST}Y_{ST} =$$

$$E_{ST}Y_{ST} + e_{Leq}(t)Y_{Leq}(t) - E_{ST}Y_{ST} = e_{Leq}(t)Y_{Leq}(t);$$

i. e the left side of the quotation is equal to the right side. Therefore, the check with Ohm's Law confirms the correctness of the derived algorithmic dependences.

Conclusion: When the same algorithmic dependences are obtained from the derived equations (3), (4), (5), (7), (8), generally referring to material mediums with electrical energy available in them, as well as from the derived equations (10), (11), (12), (13), referring to the private case of material mediums without electrical energy available in them, it means that the derived algorithmic dependences are correct. This also confirms the veracity of the summarised definition of the Thevenin and Norton's theorems.

The complex electrical admittance $Y_{Leq}(t)$[S] from quotation (3) FIG. 1 and FIG. 2:

$$Y_{Leq}(t) = \frac{[E_{ST} - V_{ab}(t)]Y_{ST}}{V_{ab}(t) - e_{Leq}(t)}$$

with $Y_{Leq}=g_{Leq}+j\omega C_{Leq}(t)$; $Y_{ST}=Y_{SN}$; $G_{SN}=G_{ST}$;

$$Y_{ST} = G_{ST} - j\frac{1}{\omega L_S};$$

angular frequency $\omega=2\pi f$ [rad/sec], where f[Hz] is frequency of a high frequency sinusoidal generator Position 1, can be written in the following form:

$$Y_{Leq}(t) = g_{Leq}(t) + j\omega C_{Leq}(t) = \frac{[E_{ST} - V_{ab}(t)]\left(G_{ST} - j\frac{1}{\omega L_S}\right)}{V_{ab}(t) - e_{Leq}(t)} \rightarrow$$

$$\rightarrow g_{Leq}(t) + j\omega C_{Leq}(t) = \frac{[E_{ST} - V_{ab}(t)]G_{ST}}{V_{ab}(t) - e_{Leq}(t)} - j\frac{E_{ST} - V_{ab}(t)}{[V_{ab}(t) - e_{Leq}(t)]\omega L_S};$$

The active electrical conductance $g_{Leq}(t)$ of the electrically powered tested material medium from quotation (14) is equal to:

$$g_{Leq}(t) = \frac{[E_{ST} - V_{ab}(t)]G_{ST}}{V_{ab}(t) - e_{Leq}(t)}[S]; \quad (15)$$

for t[sec]=$t_1, t_2, t_3 \ldots t_n$ when coequal $\Delta t$[sec] intervals are equal to $t_n$–$t_{n-1}$ From quotation (14):

$$j\omega C_{Leq}(t) = -j\frac{E_{ST} - V_{ab}(t)}{[V_{ab}(t) - e_{Leq}(t)]\omega L_S},$$

from which the Capacity (16)

$$C_{Leq}(t) = \frac{V_{ab}(t) - E_{ST}}{[V_{ab}(t) - e_{Leq}(t)]\omega^2 L_S}[F];$$

for t[sec]=$t_1, t_2, t_3 \ldots t_n$ when coequal $\Delta t$[sec] intervals are equal to $t_n$–$t_{n-1}$ the Active Electrical Resistance $$r_{Leq}(t) = \frac{1}{g_{Leq}(t)} = \frac{V_{ab}(t) - e_{Leq}(t)}{[E_{ST} - V_{ab}(t)]G_{ST}} = \frac{[V_{ab}(t) - e_{Leq}(t)]R_{ST}}{E_{ST} - V_{ab}(t)} [\Omega]; \quad (17)$$

for t[sec]=$t_1, t_2, t_3 \ldots t_n$ when coequal $\Delta$t[sec] intervals are equal to $t_n - t_{n-1}$ In the private case for tested material mediums without available electrical energy in it, i.e. when $e_{Leq}(t)=0$:

$$g_{Leq}(t) = \frac{[E_{ST} - V_{ab}(t)]G_{ST}}{V_{ab}(t)} [S]; \quad (18)$$

for t[sec]=$t_1, t_2, t_3 \ldots t_n$ when coequal $\Delta$t[sec] intervals are equal to $t_n - t_{n-1}$ $$r_{Leq}(t) = \frac{V_{ab}(t)}{[E_{ST} - V_{ab}(t)]G_{ST}} = \frac{V_{ab}(t)R_{ST}}{E_{ST} - V_{ab}(t)} [\Omega]; \quad (19)$$

for t[sec]=$t_1, t_2, t_3 \ldots t_n$ when coequal $\Delta$t[sec] intervals are equal to $t_n - t_{n-1}$ $$C_{Leq}(t) = \frac{V_{ab}(t) - E_{ST}}{V_{ab}(t)\omega^2 L_S} [F], \quad (20)$$

for t[sec]=$t_1, t_2, t_3 \ldots t_n$ when coequal $\Delta$t[sec] intervals are equal to $t_n - t_{n-1}$ The time characteristics of the short-circuited own complex current or "Norton's current" for the tested material medium, $i_{LeqN}(t)$[A] from FIG. 2 and FIG. 7 will be:

$$i_{LeqN}(t) = [i_{LeqN}(t)]_{Re} + j[i_{LeqN}(t)]_{Im} = \frac{e_{Leq}(t)}{Z_{Leq}(t)} = e_{Leq}(t)Y_{Leq}(t); \quad (21)$$

$[i_{LeqN}(t)]_{Re} + j[i_{LeqN}(t)]_{Im} = e_{Leq}(t)[g_{Leq}(t) + j\omega C_{Leq}(t)]$, from which:

$$[i_{LeqN}(t)]_{Re} = e_{Leq}(t)g_{Leq}(t)[A]; \quad (22)$$

for t[sec]=$t_1, t_2, t_3 \ldots t_n$ when coequal $\Delta$t[sec] intervals are equal to $t_n - t_{n-1}$ $$[i_{LeqN}(t)]_{Im} = e_{Leq}(t)\omega C_{Leq}(t)[A]; \quad (23)$$

for t[sec]=$t_1, t_2, t_3 \ldots t_n$ when coequal $\Delta$t[sec] intervals are equal to $t_n - t_{n-1}$ The time characteristics of the own active power of the tested material medium across the terminals "a" and "b", $P_{LeqN}(t)$[W] is equal to:

$$p_{LeqN}(t) = [i_{LeqN}(t)]_{Re} e_{Leq}(t) = [e_{Leq}(t)]^2 g_{Leq}(t)[W]; \quad (24)$$

for t[sec]=$t_1, t_2, t_3 \ldots t_n$ when coequal $\Delta$t[sec] intervals are equal to $t_n - t_{n-1}$ The time characteristics of the own reactive power of the tested material medium across the terminals "a" and "b", $g_{LeqN}(t)$[W] is equal to:

$$q_{LeqN}(t) = [i_{LeqN}(t)]_{Im} e_{Leq}(t) = [e_{Leq}(t)]^2 \omega C_{Leq}(t)[\text{VAr}]; \quad (25)$$

for t[sec]=$t_1, t_2, t_3 \ldots t_n$ when coequal $\Delta$t[sec] intervals are equal to $t_n - t_{n-1}$ The time characteristics of the own active energy of the tested material medium across the terminals "a" and "b", $[E_{LeqN}(\Delta t)]_{Re}$[J] is equal to:

$$[\varepsilon_{LeqN}(\Delta t)]_{Re} = P_{LeqN}(t)\Delta t[J]; \quad (26)$$

for t[sec]=$t_1, t_2, t_3 \ldots t_n$ when coequal $\Delta$t[sec] intervals are equal to $t_n - t_{n-1}$.

At definite longer alternating equal intervals $(\Delta T)_i = m\Delta t$ for i=1,2,3, . . . ,m, the total active energy for each $(\Delta T)_i$ interval will be $$[\varepsilon_{LeqN}(\Delta T)_i]_{Re} = \Sigma_{i=1}^m P_{LeqN}(t)_i(\Delta t)_i = \Sigma_{i=1}^m [i_{LeqN}(t)_i]$$
$$_{Re}e_{LeqN}(t)_i(\Delta t)_i = \Sigma_{i=1}^m [e_{Leq}(t)_i]^2 g_{Leq}(t)_i(\Delta t)_i \quad (27)$$

The time characteristics of the own reactive energy of the tested material medium across the terminals "a" and "b", $[\varepsilon_{LeqN}(\Delta t)]_{Im}$[J] is equal to:

(28) $[\varepsilon_{LeqN}(\Delta t)_i]_{Im} = q_{LeqN}(t)\Delta t$ for each $t=t_1, t_2, t_3, \ldots, t_n$, at successive equal intervals $\Delta t = t_n - t_{n-1}$. At definite interval $(\Delta T)_i = m\Delta t$ for i=1,2,3, . . . ,m, the total reactive energy for each $(\Delta T)_i$ interval will be equal to:

$$[\varepsilon_{LeqN}(\Delta T)_i]_{Im} = \Sigma_{i=1}^m q_{LeqN}(t)_i(\Delta t)_i = \Sigma_{i=1}^m [e_{LeqN}(t)_i]$$
$$_{Im}e_{Leq}(t)_i(\Delta t)_i = \Sigma_{i=1}^m [e_{Leq}(t)_i]^2 \omega C_{Leq}(t)_i(\Delta t)_i[J]; \quad (29)$$

The time characteristics or instantaneous values of the real components of the short-circuited current or "Norton's current", the own active power and energy of the tested material medium or objects are important diagnostic indicators. They characterise heat losses of the own energy of the tested material medium and objects, which losses in some cases have beneficial effects. In rain clouds clusters, electrical discharges, lightnings, heat up the material medium and help to speed up the raindrops. When the heart works these heat losses warm up the blood and through it the whole body of the living organisms.

What is the practicability/relevance of the proposed method and apparatus?

The advantage and innovation of the proposed method and apparatus compared to other similar methods and apparatus is the use of only one electro-measuring apparatus with a single sensor for two different in their nature magnitudes—energy and mass. Using a single sensor for capturing the prime data for both the energy and mass of the tested material medium and objects from the same non-matching pair contact points increases the accuracy because of eliminating of the defined in the Description correlation errors.

The proposed method and apparatus are efficiently applicable in constructing of specialized apparatuses for a quick evaluation of the quality of different types and electrotechnical characteristics accumulating batteries, food, liquids, fuels, surrounding space etc., in which the changes of the state of the material medium occur very slow or are not changed during the process of testing. It is also applicable in constructing of specialised apparatuses for controlling, measuring, and evaluating the states of material mediums and objects in which the changes of the state occur at great speed. Such are the changes in stormy cloud clusters when the measuring apparatus are mounted on aircrafts entering the material mediums-drones, helicopters, airplanes, etc. The changes in the medium of the heart muscle of living organisms are extremely rapid. That is why in the derived algorithmic dependences explained in the theoretical rationale for calculating of corresponding electrotechnical characteristics of the tested material medium are applied the time t[sec] at different time intervals $(\Delta T)_i$ [sec] or m-times shorter $(\Delta t)_k$ [sec] k=1, 2, 3 . . . n consecutive equal intervals, which means i=1, 2, 3 . . . n for time (t)[sec], as well as for $t=(\Delta t)_i$ [sec] and $t=(\Delta t)_k$ [sec]. For t[sec]=$t_1, t_2, t_3 \ldots t_n$ when coequal $\Delta$t[sec] intervals are equal to $t_n - t_{n-1}$ For testing of material mediums and objects with electrical energy available in them are applied the corresponding algorithmic dependences in the equations (3), (4), (5), (15), (16), (17), (21), (22), (23), (24), (25), (26), (27), (28) and (29) but for material mediums without electrical energy-in the equations (10), (11), (12), (13), (18), (19) and (20).

Another advantage and innovation of the proposed method and apparatus is the possibility to visualise not only the familiar diagnostic picture of electrotechnical characteristics in which diagnostics for the tested material mediums are made by known methodologies, but also the ability to provide additional data for new electrotechnical characteristics according to the specifics of the material mediums and objects at consumer request for wider, accurate and objective diagnostic assessment. With the calculation of the time δ-correction differences between the captured current electrotechnical characteristics of the tested material medium and objects and their corresponding standard electrotechnical characteristics from the homogenous material mediums and objects, considered to be a high-quality Norm, the process of preparing the diagnostic evaluation is facilitated and objectivised. It is because the assessment of the severity of deviations from the accepted Norm is objectively given by the apparatus in three percentage deviations from the Norm, including inadmissibility and risk according to criteria drawn up by experts with proven high professional competence. Otherwise the data users/operators assess according to their own subjective competence.

New specialised apparatuses can be constructed according to the proposed Method and Apparatus, named in common—a single-channelled or multi-channelled Rheoscope, Rheo-energy-scope or Rheocardio-scope.

These apparatuses in complicated or simplified constructive versions according to the specifics of the tested material mediums and objects provide prompt and timely information on unacceptable deviations from standard Norms in manufacturing processes as well as in risky for humans climatic changes and for medical purposes, accurate information for deviations from the normal health status of the patients. The objective of the prompt and timely assessment of the quality of the tested material medium in three acceptable intervals is to reduce inadmissibility and risks and bring them to admissibility, Attention to Norm, which is beneficial for people and is a preventive care for their lives.

Examples of Combinations of Features are Set Out Below.

(1) A circuit defined by a graphic presentation of an electrical diagram for connecting the elements in a single-channelled electrical measuring apparatus shown in FIG. 1, in which one of the terminals of an equivalent power supplied source of voltage electromotive force $E_{seqT}$ generator with zero or sinusoidal frequency, Positon1, is connected with equivalent impedance $Z_{seqT}$, position 2, formed by connected in parallel resistance $R_{seqT}$ and coil with inductance $L_s$, the end of which is connected with a closed socket in position 1 of the switch K1, part of the electromagnetic relay, position 3, as the common end of switches K1 and K2 is connected with contact electrode A with contact point "a" of the tested medium, position 4; in the general case, the tested material medium is with electrical energy available in it, presented in electrical form as a source of equivalent voltage electromotive force $e_{Leq}(t)$, connected in series with equivalent resistance $R_{Leq}(t)$, and connected in parallel capacitor with capacitance $C_{Leq}(t)$. The second contact point "b" of the tested medium, position 4 is connected by contact electrode B to the other end of the generator, position 1 and with the zero point(mass) of the apparatus; in the simultaneous position 1 of the two mechanically connected switches K1 and K2 through the closed contact of the switch K2, position 1, contact electrode A is connected to the terminal of the digital electronic voltmeter, position 5 to which the analogue signal of voltage potential difference $V_{ab}(t)$ between the points "a" and "b" of the material medium is transmitted; this digitalised signal of $V_{ab}(t)$ is transmitted from the output of the electronic voltmeter to the separate input of the microprocessor unit (MPU), position 6 at consecutive odd Δt intervals; at the simultaneous switching of the two switches K1 and K2, position 2, controlled by MPU, position 6 and the electromagnetic relay, position 3, at even Δt intervals through the connected contact electrode A with point "a" of the material medium, when electrical connection to the equivalent power supplying active bilateral network is disconnected, (Position 1 and 2) as the K1 switch is in position 2, the equivalent voltage electromotive force $e_{Leq}(t)$ between the points "a" and "b" of the material medium as analogue signal is transmitted to a digital electronic voltmeter, Position 7, and from its output to the separate input of MPU, Position 6. To separate inputs of the CPU are transmitted and memorised digitalised values of the power supplied equivalent one-portal (bilateral) network, Position 1 and 2 for the voltage electromotive force $E_{ST}$, frequency ω of the sinusoidal generator, resistance $R_{ST}$, and inductance $L_s$ of the coil; it happens during the odd equal Δt intervals, at which the time characteristic of the value of $V_{ab}(t)$ is accounted; on the basis of the stored digitalised discrete instantaneous data for the above mentioned values, according to the corresponding derived logarithmic dependencies between them and their derivatives, a software programme calculates all or a selected part of the time electrical characteristics for the quality of the tested medium in a certain volume; from the MPU, Position 6, via two-way electrical connection the data is transmitted to multi-channel visualising and control device, Position 8, 9, 11 for monitoring and selection by the operator, Position 10, and controller, Position 12. The parameters of the electric generator, Position 1, direct current or sinusoidal, the values of the elements in position 2, the software programme, the detailed electrical diagrams of the devices, positions 3, 5, 6, 7, 8, 9, 11, constructive and technological requirements, etc. are selected in the process of structural development of the individual specialised measuring devices depending on the tasks, parameters and features of the respective tested material medium.

(2) A circuit defined by a graphic presentation of a multi-channelled electrical diagram, as an example a six-channelled one shown in FIG. 8 to the terminals of electric generator with sufficient power, direct current or sinusoidal frequency, Position 1, connected to the corresponding n number of pairs of contact points $a_1b_1$, $a_2b_2$, ..., $a_nb_n$ of the tested medium in a certain volume, Position 4; received and processed by a software programme from the respective MPU, Position 6, information about their corresponding time electrical characteristics is transmitted via two-way electrical connection from each MPU, Position 6, to the central MPU, Position13, which synchronises the parallel operation of the MPUs; by means of a two-way electrical connection with a multi-channelled visualising and controlling device, Position 8, and a printer, Position 9, the operator, Position 10, is enabled to monitor and document the data from the operation of the electrical measuring equipment; from a MPU, Position 13, via two-way wired or wireless connection, all information with the time electrotechnical characteristics, including those electronically analysed as a diagnostic information, can be obtained on a multi-channelled visualisation and command device, Position 11, for a controlling organ or consultant; the technical characteristics and parameters of the respective devices, their detailed diagrams, the values of the elements, functional capabilities, software, etc. are determined in the process of constructive development of specialised electrical measuring devices depending on the respective task, features, and parameters of the tested material medium.

(3) A method for determining time characteristic of the equivalent electrical admittance $Y_{Leq}(t)$, as well as, the time characteristics of reciprocal and equivalent electrical impedance $$Z_{Leq}(t) = \frac{1}{Y_{Leq}(t)}$$

in a randomly selected $L^{th}$ active branch from a randomly complex linear or linearised circuit, respectively between two contact points (a) and (b) of the tested medium with available electrical energy in it, included as $L^{th}$ active branch in the electro-measuring circuit, described in (1) and (2) by the algorithmic dependency:

$$Y_{Leq}(t) = \frac{[E_{ST} - V_{ab}(t)]Y_{ST}}{V_{ab}(t) - e_{Leq}(t)}$$

for $t=t_1, t_2, t_3 \ldots t_n$ when coequal intervals $\Delta t=t_n-t_{n-1}$, where $E_{ST}$ is equivalent voltage electromotive force of an equivalent power supplied active one-portal (bilateral) network in which the entire remaining part of the electrical circuit is reduced in relation to both ends of the selected $L^{th}$ branch when the electrical connection to this branch is disconnected;

$$Y_{ST} = \frac{1}{Z_{ST}}$$

is the equivalent electrical admittance equal to the reciprocal value of the equivalent electrical impedance $Z_{ST}$ of that equivalent power supplied active one-portal (bilateral) network; $e_{Leq}(t)$ is equivalent voltage electromotive force of an equivalent active one-portal (bilateral) network, in which the selected L' active branch is reduced when is electrically disconnected from the rest of the electrical circuit;

$V_{ab}(t)$ is voltage potential difference formed between the edges of the selected $L^{th}$ active branch when electric current $i_L(t)$ flows through this branch under the influence of the two parallel-linked equivalent active one-portal (bilateral) networks, in which the entire electrical circuit is actually reduced under the above conditions and zero or the same sinusoidal frequency, ideal or idealized sources of electrical energy in it; these conditions are available in the operation of Electrical diagrams in (1) and (2).

(4) A method for determining the time characteristics of the equivalent complex electrical admittance $Y_{Leq}(t)$ and its reciprocal equivalent complex electrical impedance $$Z_{Leq}(t) = \frac{1}{Y_{Leq}(t)}$$

in a randomly selected $L^{th}$ passive branch, without an electrical source, of a randomly complex linear or linearized circuit, respectively between two contact points (a) and (b) of the medium without the availability of electrostatic energy, included as an $L^{th}$ passive branch in the electromeasuring circuit by the algorithmic dependency:

$$Y_{Leq}(t) = \frac{[E_{ST} - V_{ab}(t)]Y_{ST}}{V_{ab}(t)}$$

for $t=t_1, t_2, t_3 \ldots t_n$ when coequal intervals $\Delta t=t_n-t_{n-1}$, where the values in the algorithm, the conditions and the way they are formed are the same as described in (3) when $e_{Leq}(t)=0$.

(5) A method for determining the time characteristics of the equivalent active electrical conductance $g_{Leq}(t)$ and reciprocal equivalent electrical resistance $$r_{Leq}(t) = \frac{1}{g_{Leq}(t)}$$

in a randomly selected $L^{th}$ active branch of an electrical circuit, respectively between two contact points (a) and (b) of the tested medium with the availability of electrostatic energy, included as an $L^{th}$ active branch of an electromeasuring circuit by the algorithmic dependency:

$$g_{Leq}(t) = \frac{[E_{ST} - V_{ab}(t)]G_{ST}}{V_{ab}(t) - e_{Leq}(t)},$$

for $t=t_1, t_2, t_3 \ldots t_n$ when coequal intervals $\Delta t=t_n-t_{n-1}$, where is $$G_{ST} = \frac{1}{R_{ST}}$$

an active electrical conductance, $R_{ST}$ is an active electrical resistance of the equivalent power supplied one-portal (bilateral) network, and the other values, conditions and the way they are formed are described in (3).

(6) A method for determining the time characteristics of the equivalent active electrical conductance $g_{Leq}(t)$ and its reciprocal equivalent electrical resistance $$r_{Leq}(t) = \frac{1}{g_{Leq}(t)}$$

in a randomly selected $L^{th}$ passive branch of an electrical circuit, respectively between two contact points (a) and (b) of the tested material medium without the availability of electrical energy, included as $L^{th}$ passive branch in the electro-measuring circuit, by the algorithmic dependency:

$$g_{Leq}(t) = \frac{[E_{ST} - V_{ab}(t)]G_{ST}}{V_{ab}(t)},$$

for t=$t_1, t_2, t_3 \ldots t_n$ when coequal intervals $\Delta t = t_n - t_{n-1}$, where the values, conditions and the way they are formed are described in (3) and (5) when $e_{Leq}(t)=0$.

(7) A method for determining the time characteristic of the capacity of an equivalent capacitor $C_{Leq}(t)$ in a selected $L^{th}$ active branch of an electrical circuit of capacitive nature, respectively between two contact points (a) and (b) of the tested material medium with the availability of electrostatic energy of capacitive nature, included in an electro-measuring circuit as an $L^{th}$ branch by the algorithmic dependency:

$$C_{Leq}(t) = \frac{V_{ab}(t) - E_{ST}}{[V_{ab}(t) - e_{Leq}(t)]\omega^2 L_S}$$

for t=$t_1, t_2, t_3 \ldots t_n$ when coequal intervals $\Delta t = t_n - t_{n-1}$, where co is an angular frequency of an equivalent sinusoidal source supplying an active electric one-portal (bilateral) network with successively connected equivalent active resistance and coil with inductance $L_s$, and the other values, conditions and the way they are formed are described in (3).

(8) A method for determining the time characteristic of the capacity of an equivalent capacitor $C_{Leq}(t)$ in a selected $L^{th}$ passive branch of an electrical circuit of capacitive nature, respectively between two contact points (a) and (b) of the tested material medium of capacitive nature, without the availability of electrostatic energy $e_{Leq}(t)=0$, included in an electro-measuring circuit as an $L^{th}$ branch by the algorithmic dependency:

$$C_{Leq}(t) = \frac{V_{ab}(t) - E_{ST}}{[V_{ab}(t)]\omega^2 L_S}$$

for t=$t_1, t_2, t_3 \ldots t_n$ when coequal intervals $\Delta t = t_n - t_{n-1}$, where the values in the algorithm, conditions and the way they are formed are described in (3) and (7).

(9) A method for determining the time characteristic of the equivalent own complex current through the short circuit, called Norton's current $i_{LeqN}(t)$, which would run along the short circuit between the two ends of a selected $L^{th}$ active branch of an electrical circuit when this branch is disconnected from the entire remaining part of the electrical circuit, respectively Norton's own complex current through the short circuit between two contact points (a) and (b) of the tested material medium, with the availability of electrostatic energy, included as an $L^{th}$ active branch in the electrical-measuring circuit when this branch is disconnected from the entire remaining part of the electro-measuring circuit, by the algorithmic dependency:

$i_{LeqN}(t)=V_{ab}(t)[Y_{ST}+Y_{Leq}(t)]-I_{SN}$ for t=$t_1, t_2, t_3 \ldots t_n$ when coequal intervals $\Delta t = t_n - t_{n-1}$, where $$I_{SN} = \frac{E_{ST}}{Z_{ST}}$$

is the short circuit current or Norton's current, which would run through the short circuit between the two ends of the equivalent power supplying active electric one-portal (bilateral) network, in which the entire remaining part of the electrical circuit is reduced, in relation to the ends of the selected L' branch when electrical connection to that branch is disconnected, the other values included in the algorithm, the conditions and the way they are formed are described in (3).

(10) A method for determining the time characteristic of the real component of Norton's complex current $[i_{LeqN}(t)]_{Re}$ between the ends of a selected $L^{th}$ active branch of an electrical circuit when this branch is disconnected from the entire remaining part of the electro-measuring circuit, respectively the actual component of Norton's complex current between two contact points (a) and (b) of the test medium with the availability of electrostatic energy included as an $L^{th}$ active branch of the electrical measuring circuit by the algorithmic dependency:

$$[i_{LeqN}(t)]_{Re} = \frac{e_{Leq}(t)}{r_{Leq}(t)} = e_{Leq}(t)g_{Leq}(t)$$

for t=$t_1, t_2, t_3 \ldots t_n$ when coequal intervals $\Delta t = t_n - t_{n-1}$, where the values included in the algorithm, the conditions and the way they are formed are described in (3), (5) and (9); this characteristic can also be obtained by the product of the readings of two independent electrical measuring devices, one of which measures $e_{Leq}(t)$ of the tested medium and the other $g_{Leq}(t)$.

(11) A method for determining the time characteristic of the imaginary component of Norton's complex current $[i_{LeqN}(t)]_{Im}$ between the ends of a selected $L^{th}$ active branch of capacitive nature of an electrical circuit, respectively the imaginary component of Norton's complex current between two contact points (a) and (b) of the tested medium with the availability of electrostatic energy and capacitive character, included as an $L^{th}$ branch in the electrical measuring circuit by the algorithmic dependency: $[i_{LeqN}(t)]_{Im}=e_{Leq}(t)\omega C_{Leq}(t)$, for t=$t_1, t_2, t_3 \ldots t_n$ when coequal intervals $\Delta t = t_n - t_{n-1}$, where the values included in the algorithm, the conditions and the way they are formed are described in (3), (7) and (9).

(12) A method for determining the time characteristic of the own active power $P_{LeqN}(t)$ in a selected $L^{th}$ active branch of an electrical circuit, respectively the own active power between two contact points (a) and (b) of the tested material medium with the availability of electrostatic energy, included as an $L^{th}$ active branch in the electrical measuring circuit by the algorithmic dependency: $P_{LeqN}(t)=[i_{LeqN}(t)]_{Re}e_{Leq}=[e_{Leq}(t)]^2 g_{Leq}(t)$, for t=$t_1, t_2, t_3 \ldots t_n$ when coequal intervals $\Delta t = t_n - t_{n-1}$, where the values included in the algorithm, the conditions and the way they are formed are described in (3), (9) and (10).

(13) A method for determining the time characteristic of the own reactive power $g_{LeqN}(t)$ in a selected Lth active branch of capacitive nature from an electrical circuit, respectively the own reactive power between two contact points (a) and (b) of the tested material medium with capacitive nature and the availability of electrostatic energy, included as an Lth active branch in the electro-measuring circuit by the algorithmic dependency: $q_{LeqN}(t)=[i_{LeqN}(t)]_{Im}e_{Leq}(t)=[e_{Leq}(t)]^2\omega C_{Leq}(t)$, for $t=t_1, t_2, t_3 \ldots t_n$ when coequal intervals $\Delta t=t_n-t_{n-1}$, where the values included in the algorithm, the conditions and the way they are formed are described in (3), (7) and (11).

(14) A method for determining the time characteristic of the own active electrical energy $[\varepsilon_{LeqN}(\Delta t)]_{Re}$ in an Lth active branch of an electrical circuit, respectively of the own active electrical energy between two contact points (a) and (b) of the tested medium with the availability of electrostatic energy in it, included as an Lth active branch in the electro-measuring circuit by the algorithmic dependency: $[\varepsilon_{LeqN}(\Delta t)]_{Re}=p_{LeqN}(t)(\Delta t)$ for $t=t_1, t_2, t_3 \ldots t_n$ at successive coequal intervals $\Delta t=t_n-t_{n-1}$. At definite longer alternating equal intervals $(\Delta T)_i=m\Delta t$ for $t=1,2,3, \ldots, m$, the total active energy for each $(\Delta T)_i$ interval will be $[\varepsilon_{LeqN}(\Delta T_i)]_{Re}=\Sigma_{i=1}^m P_{LeqN}(t)_i(\Delta t)_i=\Sigma_{i=1}^m [e_{Leq}(t)_i]^2 g_{Leq}(t)_i(\Delta t)_i$ The number (m) is non dimensional integer. The values included in the algorithm, the conditions, and the way they are formed are described in (3), (5), (9), (10) and (12).

(15) A method for determining the time characteristic of the own reactive electrical energy $[\varepsilon_{LeqN}(\Delta t)]_{Im}$ in a chosen Lth active branch of capacitive nature from an electrical circuit, respectively of its own reactive electrical energy between two contact points (a) and (b) of tested material medium with capacitive nature and the availability of electrostatic energy in it, by algorithmic dependency $[\varepsilon_{LeqN}(\Delta t)]_{Im}=q_{LeqN}(t)(\Delta t)$ for each $t=t_1, t_2, t_3 \ldots t_n$ at successive coequal intervals $\Delta t=t_n-t_{n-1}$. At definite interval $(\Delta T)_i=m\Delta t$ for $i=1,2,3, \ldots, m$, the total reactive energy for each $(\Delta T)_i$ interval will be equal to $[\varepsilon_{LeqN}(\Delta T)_i]_{Im}=\Sigma_{i=1}^m q_{LeqN}(t)_i(\Delta t)_i=\Sigma_{i=1}^m [e_{Leq}(t)_i]^2 \omega C_{Leq}(t)_i(\Delta t)_i[J]$ The number (m) is non dimensional integer. The values included in the algorithm, the conditions, and the way they are formed are described in (3), (5), (9), (11) and (13).

(16) A method for determining the time characteristic of current $i_L(t)$, flowing through a selected $L^{th}$ active branch of an electrical circuit, respectively between two contact points (a) and (b) of the tested medium with the availability of electrostatic energy in it, included as an $L^{th}$ active branch in the electrical circuit by the algorithmic dependency:

$$i_L(t) = \frac{E_{ST} - e_{Leq}(t)}{Z_{ST} + Z_{Leq}(t)} = \frac{I_{SN} Z_{ST} - e_{Leq}(t)}{Z_{ST} + Z_{Leq}(t)},$$

for $t=t_1, t_2, t_3 \ldots t_n$ when coequal intervals $\Delta t=t_n-t_{n-1}$, where the values included in the algorithm, the conditions and the way they are formed are described in (3) and (9).

As used herein, a feature preceded by "a" or "an" does not exclude the existence of further features of the same type. In addition, terms such as "first" and "second" etc. may be used herein merely to distinguish one component or action from another, without implying any relationship or order between them.

The various components, features, benefits and advantages of the disclosure that have been described herein are merely illustrative, and are not intended to limit the scope of protection in any way. Various further modifications to the above described examples, whether by way of addition, deletion or substitution, will be apparent to the skilled person to provide additional examples, any and all of which are intended to be encompassed by the appended claims.

What is claimed is:

1. An apparatus for determining a plurality of electrical parameters, the apparatus comprising:
a signal generator;
first and second electrodes, the second electrode being connected to a first terminal of the signal generator;
a processor; and
a first switch configured to connect the first electrode to the processor, the first switch having a first position and a second position,
wherein the processor is configured to determine one or more voltage values based on a signal received from the first electrode via the first switch in the first position, and to determine one or more electromotive force values based on a signal received from the first electrode via the first switch in the second position.

2. The apparatus of claim 1, wherein the processor is configured to control the first switch to move between said first position and said second position.

3. The apparatus of claim 1, further comprising a second switch configured to selectively connect the first electrode to a second terminal of the signal generator, the second switch having a first position in which the first electrode is connected to the second terminal of the signal generator and a second position in which the first electrode is disconnected from the second terminal of the signal generator.

4. The apparatus of claim 3, wherein the processor is configured to control the second switch to move between said first position and said second position.

5. The apparatus of claim 4, wherein the processor is configured to control the first switch and the second switch to simultaneously move between said first positions and said second positions.

6. The apparatus of claim 1, wherein the processor has a first input and a second input, and:
when in the first position, the first switch connects the first electrode to said first input, and
when in the second position, the first switch connects the first electrode to said second input.

7. The apparatus of claim 1, further comprising a memory connected to the processor, wherein the memory is configured to store one or more reference voltage values and one or more reference electromotive force values,
wherein the processor is configured to:
compare the determined voltage values against the stored reference voltage values,
compare the determined electromotive force values against the stored reference electromotive force values, and
output a result of the comparisons.

8. The apparatus of claim 1, further comprising a display connected to the processor and configured to output information relating to the determined voltage values and/or the determined electromotive force values.

9. The apparatus of claim 1, further comprising a complex electrical impedance connected to a second terminal of the signal generator.

10. The apparatus of claim 1, wherein the signal generator is a high frequency sine wave generator.

11. A system for determining a plurality of electrical parameters, the system comprising:
a signal generator; and
a plurality of channels, at least one of the channels comprising:

first and second electrodes, the second electrode being connected to a first terminal of the signal generator, a processor, and a first switch configured to connect the first electrode to the processor, the first switch having a first position and a second position, wherein the processor is configured to determine one or more voltage values based on a signal received from the first electrode via the first switch in the first position, and to determine one or more electromotive force values based on a signal received from the first electrode via the first switch in the second position.

12. The system of claim 11, wherein the processor is configured to control the first switch to move between said first position and said second position.

13. The system of claim 11, wherein at least one of the channels further comprises a second switch configured to selectively connect the first electrode to a second terminal of the signal generator, the second switch having a first position in which the first electrode is connected to the second terminal of the signal generator and a second position in which the first electrode is disconnected from the second terminal of the signal generator.

14. The system of claim 13, wherein the processor is configured to control the second switch to move between said first position and said second position.

15. The system of claim 14, wherein the processor is configured to control the first switch and the second switch to simultaneously move between said first positions and said second positions.

16. The system of claim 11, wherein the processor has a first input and a second input, and:

when in the first position, the first switch connects the first electrode to said first input, and when in the second position, the first switch connects the first electrode to said second input.

17. The system of claim 11, wherein at least one of the channels comprises a memory connected to the processor, wherein the memory is configured to store one or more reference voltage values and one or more reference electromotive force values, wherein the processor is configured to:

compare the determined voltage values against the stored reference voltage values, compare the determined electromotive force values against the stored reference electromotive force values, and output a result of the comparisons.

18. The system of claim 11, further comprising a master processor configured to control and synchronize the operations of the plurality of channels.

19. A method of determining a plurality of electrical parameters, the method comprising:

setting a switch in a first position, the switch being connected to a first electrode;

supplying a signal to a second electrode;

determining one or more voltage values based on a signal received from the first electrode via the switch in the first position;

setting the switch in a second position; and determining one or more electromotive force values based on a signal received from the first electrode via the switch in the second position.

20. The method of claim 19, further comprising:

comparing the determined voltage values against one or more stored reference voltage values, comparing the determined electromotive force values against one or more stored reference electromotive force values, and output a result of the comparisons.

* * * * *